US012690168B2

(12) United States Patent
Yarragunta et al.

(10) Patent No.: US 12,690,168 B2
(45) Date of Patent: Jul. 21, 2026

(54) MEMORY SUB-SYSTEM ENCLOSURE

(71) Applicant: Micron Technology, Inc., Boise, ID (US)

(72) Inventors: Suresh Reddy Yarragunta, Bangalore (IN); Deepu Narasimiah Subhash, Yeshwanthpu (IN); Ravi Kumar Kollipara, Puppalaguda (IN)

(73) Assignee: Micron Technology, Inc., Boise, ID (US)

( * ) Notice: Subject to any disclaimer, the term of this patent is extended or adjusted under 35 U.S.C. 154(b) by 181 days.

(21) Appl. No.: 18/597,310

(22) Filed: Mar. 6, 2024

(65) Prior Publication Data

US 2024/0268077 A1     Aug. 8, 2024

Related U.S. Application Data

(63) Continuation-in-part of application No. 18/204,704, filed on Jun. 1, 2023, now Pat. No. 12,402,242.

(30) Foreign Application Priority Data

Sep. 28, 2022     (IN) .............................. 202241055639

(51) Int. Cl.
H05K 7/20 (2006.01)
(52) U.S. Cl.
CPC ................................ H05K 7/20409 (2013.01)
(58) Field of Classification Search
CPC ............. H05K 1/0209; H05K 7/20409; H05K 7/20509; H05K 2201/066; H05K 2201/10159; G06F 1/20
See application file for complete search history.

(56) References Cited

U.S. PATENT DOCUMENTS 5,847,928 A     12/1998   Hinshaw et al.
5,883,782 A     3/1999    Thurston et al.
(Continued)

FOREIGN PATENT DOCUMENTS

CN        117789775      3/2024
KR        20210152914    12/2021
(Continued)

OTHER PUBLICATIONS

"U.S. Appl. No. 18/204,704, Non Final Office Action mailed Mar. 13, 2025", 11 pgs.
(Continued)

*Primary Examiner* — Allen L Parker
*Assistant Examiner* — Peter Krim
(74) *Attorney, Agent, or Firm* — Schwegman Lundberg & Woessner, P.A.

(57)        ABSTRACT

Aspects of the present disclosure are directed to a memory sub-system with isothermal cooling of components. A PCB assembly may be secured between a heat spreader and a heat sink that are thermally coupled. The heat sink radiates heat absorbed from both sides of the PCB assembly. By connecting the heat spreader to the heat sink, heat is more effectively transferred from the side of the PCB assembly not directly connected to the heat sink. The PCB assembly may be secured between a top enclosure and a bottom enclosure. The top enclosure and the bottom enclosure may be thermally coupled using a vapor chamber. The vapor chamber pumps heat from a higher-temperature side of the PCB assembly to a lower-temperature side of the PCB assembly. By using the vapor chamber to thermally couple the top and bottom enclosures, creation of hot spots is avoided.

18 Claims, 9 Drawing Sheets

(56)                References Cited

U.S. PATENT DOCUMENTS

| | | | | |
|---|---|---|---|---|
| 6,308,771 | B1 * | 10/2001 | Tavassoli | H01L 23/467 |
| | | | | 257/722 |
| 7,174,628 | B1 | 2/2007 | Wang et al. | |
| 7,520,316 | B2 * | 4/2009 | Xia | F28D 15/0275 |
| | | | | 165/104.21 |
| 7,861,768 | B1 * | 1/2011 | Ghantiwala | H01L 23/427 |
| | | | | 165/104.21 |
| 10,354,938 | B2 | 7/2019 | Bilan et al. | |
| 10,674,621 | B1 | 6/2020 | Tsorng et al. | |
| 10,674,640 | B1 * | 6/2020 | Kao | H02M 7/003 |
| 12,315,779 | B1 * | 5/2025 | Gregory | H01L 23/4006 |
| 12,402,242 | B2 | 8/2025 | Yarragunta et al. | |
| 2003/0058621 | A1 | 3/2003 | Wells | |
| 2004/0042178 | A1 | 3/2004 | Gektin et al. | |
| 2005/0068740 | A1 | 3/2005 | Ulen et al. | |
| 2006/0002089 | A1 | 1/2006 | Tran et al. | |
| 2009/0310310 | A1 * | 12/2009 | Anzai | H10W 40/43 |
| | | | | 165/185 |
| 2015/0106660 | A1 | 4/2015 | Chumbalkar et al. | |
| 2020/0137896 | A1 * | 4/2020 | Elenitoba-Johnson | |
| | | | | G06F 13/409 |
| 2021/0013125 | A1 | 1/2021 | North et al. | |
| 2021/0181819 | A1 | 6/2021 | Scobee et al. | |
| 2021/0193558 | A1 | 6/2021 | Miele et al. | |
| 2021/0195727 | A1 | 6/2021 | Breicher et al. | |
| 2022/0030748 | A1 | 1/2022 | Chang et al. | |
| 2023/0012108 | A1 | 1/2023 | Choi et al. | |
| 2023/0240057 | A1 | 7/2023 | Hung et al. | |
| 2023/0314736 | A1 * | 10/2023 | Cheng | G02B 6/4246 |
| 2023/0392874 | A1 * | 12/2023 | Cheng | H05K 7/20809 |
| 2023/0397366 | A1 * | 12/2023 | Okada | H05K 7/20263 |
| 2023/0420338 | A1 | 12/2023 | Subrahmanyam et al. | |
| 2024/0090116 | A1 * | 3/2024 | Gupta | H05K 7/20336 |
| 2024/0107657 | A1 | 3/2024 | Yarragunta et al. | |
| 2024/0114659 | A1 | 4/2024 | Gupta et al. | |
| 2025/0351260 | A1 | 11/2025 | Yarragunta et al. | |

FOREIGN PATENT DOCUMENTS

| | | |
|---|---|---|
| WO | 2023147156 | 8/2023 |
| WO | WO-2025188865 A1 | 9/2025 |
| WO | WO-2025188865 A8 | 10/2025 |

OTHER PUBLICATIONS

"U.S. Appl. No. 18/204,704, Response filed Apr. 10, 2025 to Non Final Office Action mailed Mar. 13, 2025", 7 pgs.

"U.S. Appl. No. 18/204,704, Notice of Allowance mailed Apr. 24, 2025", 10 pgs.

"International Application Serial No. PCT US2025 018525, International Search Report mailed Jun. 18, 2025", 11 pgs.

"International Application Serial No. PCT US2025 018525, Written Opinion mailed Jun. 18, 2025", 4 pgs.

* cited by examiner

400

420

440B

440A

440D

440C

430B

410

430A

440E

440G

440F

450

Without U-shaped Vapor Chamber

With U-shaped Vapor Chamber

800

810

ADD A MEMORY COMPONENT TO A PRINTED CIRCUIT BOARD (PCB)

820

ADD A PROCESSING DEVICE COUPLED TO THE MEMORY COMPONENT TO THE PCB

830

SECURING AN ENCLOSURE COMPRISING A BOTTOM HEAT SPREADER AND A TOP PORTION TO THE PCB, THE BOTTOM HEAT SPREADER ALLOWING THE DISTRIBUTION OF HEAT AMONG COMPONENTS ON A BOTTOM OF THE PCB

MEMORY SUB-SYSTEM ENCLOSURE

PRIORITY APPLICATION

This application is a continuation-in-part of U.S. patent application Ser. No. 18/204,704, filed on Jun. 1, 2023, which claims priority to Indian Patent Application Serial No. 202241055639, filed on Sep. 28, 2022, each of which is incorporated herein by reference in its entirety.

TECHNICAL FIELD

The present disclosure generally relates to memory sub-systems and, more specifically, to enclosures for memory sub-systems.

BACKGROUND

A memory sub-system can be a storage system, such as a solid-state drive (SSD), and can include one or more memory components that store data. The memory components can be, for example, non-volatile memory components and volatile memory components. The memory components can be affixed to a printed circuit board (PCB). In general, a host system can utilize a memory sub-system to store data at the memory components and to retrieve data from the memory components.

Executing memory access commands generates heat. If the temperature of a memory sub-system exceeds a safe operating temperature, data may be lost or the memory sub-system may be permanently damaged. The memory sub-system may include a thermal sensor to monitor the temperature of the memory sub-system. To prevent over-heating, in response to detecting that the temperature has reached a predetermined threshold, the rate of processing memory access commands may be reduced. This is referred to as thermal throttling.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
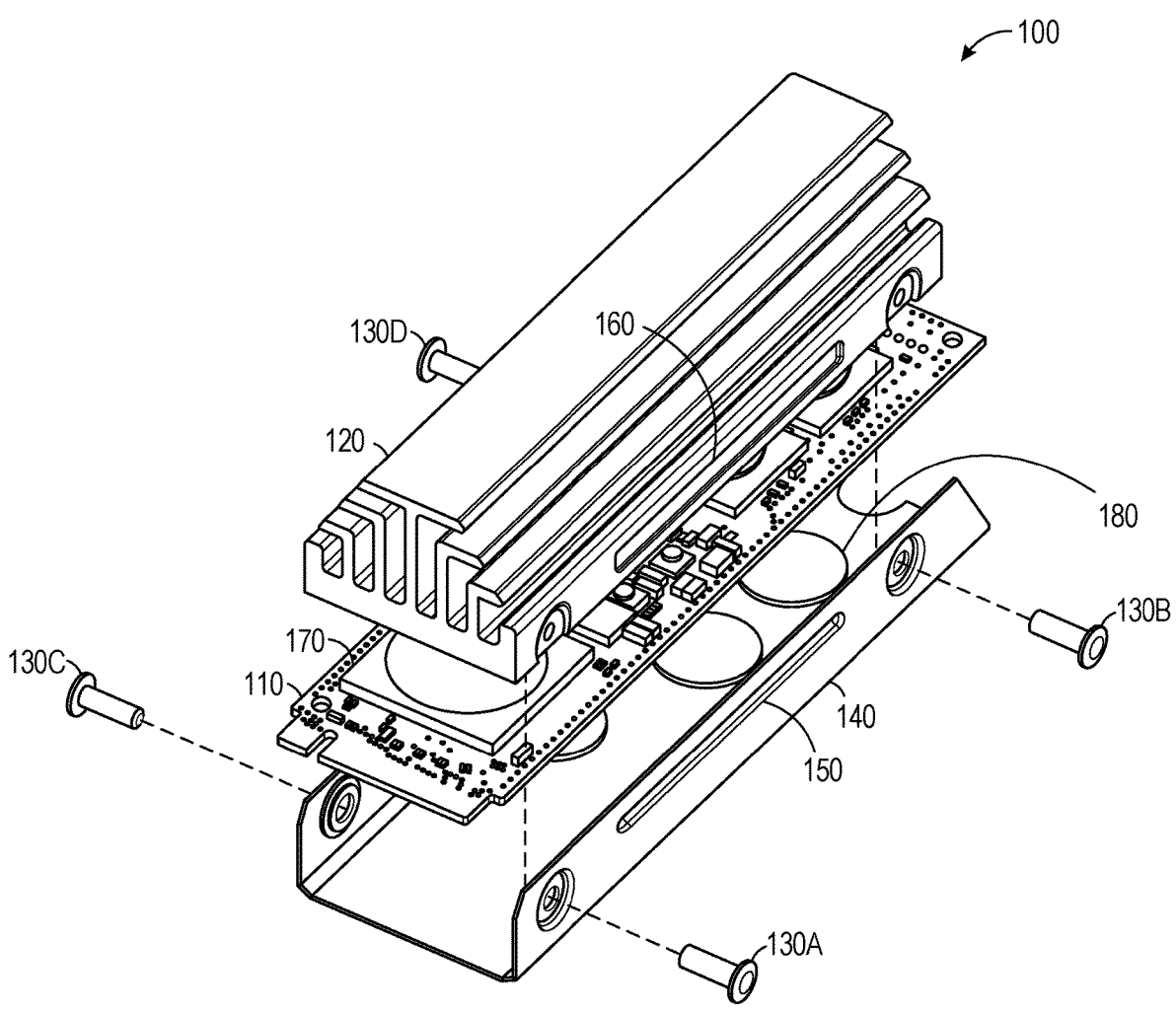
FIG. 1 illustrates an example memory sub-system in accordance with some embodiments of the present disclosure, in an exploded view.

Aspects of the present disclosure are directed to a memory sub-system with isothermal cooling of components. In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

A PCB assembly may be secured between a heat spreader and a heat sink. The heat spreader spreads heat from high-temperature components on one side of the PCB assembly to low-temperature components and the heat spreader itself. The terms "low-temperature" and "high-temperature" are relative to each other and don't refer to specific temperatures. Both the low-temperature components and the high-temperature components may be warmer than the ambient environment.

The heat spreader is coupled to the heat sink. The heat sink radiates heat absorbed from another side of the PCB assembly and from the heat spreader. By connecting the heat spreader to the heat sink, heat is more effectively transferred from the side of the PCB assembly not directly connected to the heat sink.

An SSD may have components on both the primary and the secondary side of the PCB to efficiently utilize the PCB floor plan and balance the heat transfer to the enclosure top and bottom surfaces. However, most of the enclosure construction is not symmetric due to interface connector z-height which allows for only one side of the enclosure design to have fins. The other side will have a solid metal surface for heat transfer. Due to these construction constraints, the SSD will have unbalanced heat load on PCB and enclosure which leads to thermal challenges to work reliably within the junction temperature.

Discussed herein are methodologies and arrangements of enclosure designs to effectively transfer heat from the bottom enclosure where it experiences more power dissipation and less exchange area to the top enclosure that has heatsink fins and more heat exchange area available to improve thermal efficiency. Thus, isothermal cooling of the critical components to balance heat transfer is improved, thereby improving the components' reliability.

Furthermore, the improved heat transfer between the two sides of the PCB provides increased flexibility in design, since high-heat components may be placed on either side of the PCB.

The PCB assembly may be secured between a top enclosure and a bottom enclosure. The top enclosure and the bottom enclosure may be thermally coupled using a vapor chamber (e.g., a U-shaped titanium-based vapor chamber). The vapor chamber pumps heat from a higher-temperature side of the PCB assembly to a lower-temperature side of the PCB assembly. The top and bottom enclosure absorb heat from the PCB assembly, the vapor chamber, or both. By using the vapor chamber to thermally couple the top and bottom enclosures, heat generated by components in the enclosure increases the temperature of the entire enclosure more evenly, avoiding the creation of hot spots.

Figure 9:
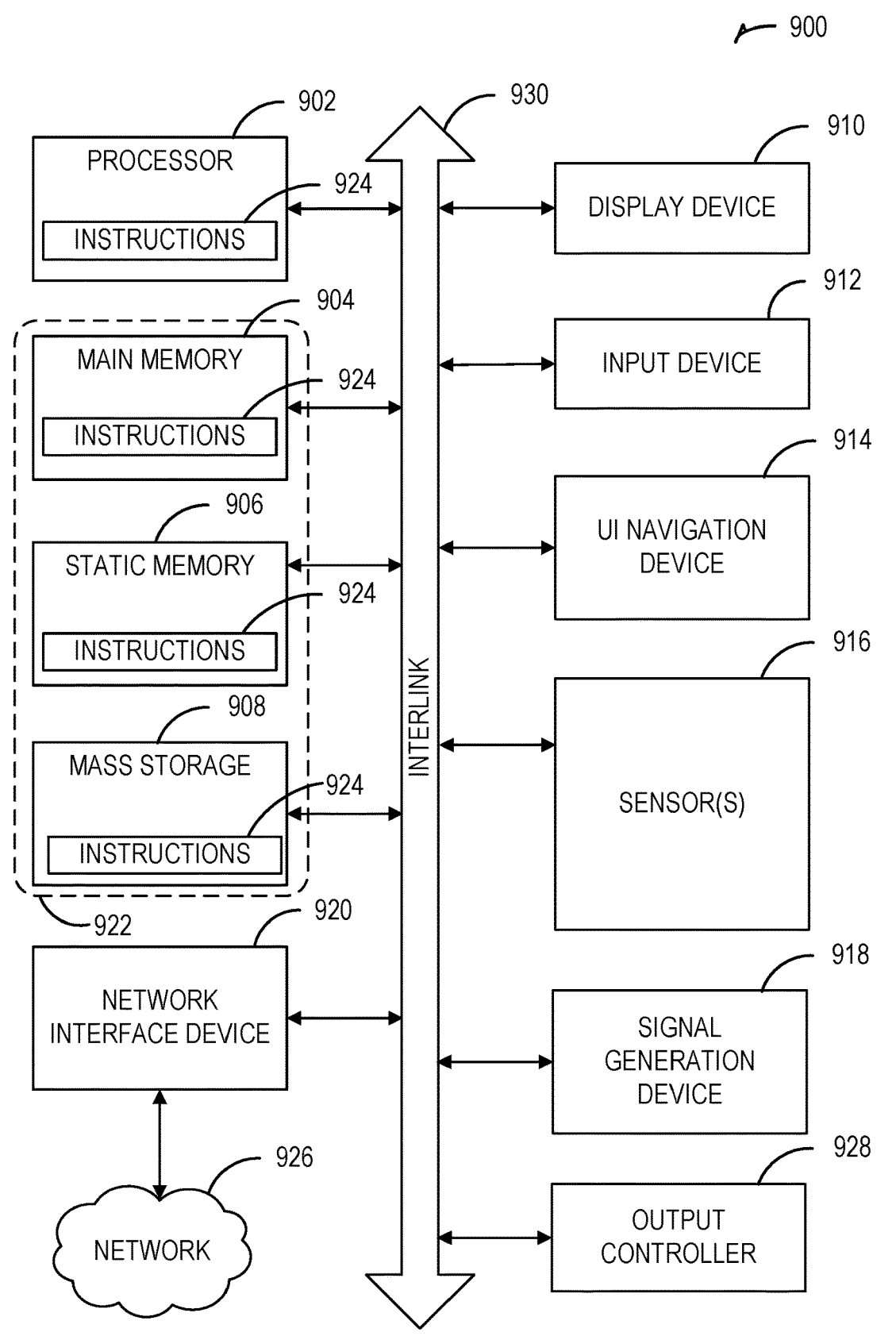
FIG. 9 illustrates an example machine of a computer system within which a set of instructions can be executed for causing the machine to perform any one or more of the methodologies discussed herein.

FIG. 1 illustrates an example memory sub-system 100 in accordance with some embodiments of the present disclosure, in an exploded view. The sub-system 100 can include memory components (e.g., memory component 170) soldered to a PCB 110. The memory components can be volatile memory components, non-volatile memory components, or a combination of such. In some embodiments, the memory sub-system 100 is a storage system. An example of a storage system is an SSD. In some embodiments, the memory sub-system 100 is a hybrid memory/storage subsystem. In general, the memory sub-system 100 may be part of or coupled to a host system that uses the memory sub-system 100. For example, the host system can write data to the memory sub-system 100 and read data from the memory sub-system 100. An example host system is shown in FIG. 9.

The host system can be a computing device such as a desktop computer, laptop computer, network server, mobile device, or such computing device that includes a memory and a processing device. The host system can include or be coupled to the memory sub-system 100 so that the host system can read data from or write data to the memory sub-system 100. The host system can be coupled to the memory sub-system 100 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system and the memory sub-system 100. The host system can further utilize an NVM Express (NVMe) interface to access the memory components when the memory sub-system 100 is coupled with the host system by the PCIe interface. The physical host interface can provide an interface for passing control, address, data, and other signals between the memory sub-system 100 and the host system.

The memory components can include any combination of the different types of non-volatile memory components and/or volatile memory components. An example of non-volatile memory components includes a negative-and (NAND) type flash memory. Each of the memory components can include one or more arrays of memory cells such as SLCs, or MLCs (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system. Although non-volatile memory components such as NAND type flash memory are described, the memory components can be based on any other type of memory such as a volatile memory. In some embodiments, the memory components can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components can be grouped as memory pages or data blocks that can refer to a unit of the memory component used to store data.

The memory-subsystem 100 may include a memory system controller (hereinafter referred to as "controller") soldered to the PCB 110. The controller can communicate with the memory components to perform operations such as reading data, writing data, or erasing data at the memory components and other such operations. The controller can include hardware such as one or more integrated circuits and/or discrete components, a buffer memory, or a combination thereof. The controller can be a microcontroller, special purpose logic circuitry (e.g., a field programmable gate array (FPGA), an application specific integrated circuit (ASIC), etc.), or other suitable processor. The controller can include a processor (processing device) configured to execute instructions stored in local memory. For example, the local memory of the controller may include an embedded memory configured to store instructions for performing various processes, operations, logic flows, and routines that control operation of the memory sub-system 100, including handling communications between the memory sub-system 100 and the host system. In some embodiments, the local memory can include memory registers storing memory pointers, fetched data, etc. The local memory can also include read-only memory (ROM) for storing micro-code. The local memory may include a logical-to-physical table for lookup of physical addresses in the memory components from logical addresses used by the host.

While the example memory sub-system 100 in FIG. 1 has been described as including the controller, in another embodiment of the present disclosure, a memory sub-system 100 may not include a controller, and may instead rely upon external control (e.g., provided by an external host, or by a processor or controller separate from the memory sub-system 100). In general, the controller can receive commands or operations from the host system and can convert the commands or operations into instructions or appropriate commands to achieve the desired access to the memory components. The controller can be responsible for other operations such as wear-leveling operations, garbage collection operations, error detection and error-correcting code (ECC) operations, encryption operations, caching operations, and address translations between a logical address and a physical address that are associated with the memory components. The controller can further include host interface circuitry to communicate with the host system via the physical host interface. The host interface circuitry can convert the commands received from the host system into command instructions to access the memory components as well as convert responses associated with the memory components into information for the host system.

The memory sub-system 100 can also include additional circuitry or components that are not illustrated. In some embodiments, the memory sub-system 100 can include a cache or buffer (e.g., DRAM) and address circuitry (e.g., a row decoder and a column decoder) that can receive a logical address from the controller and decode the logical address to one or more physical addresses at the memory components.

The memory sub-system 100 of FIG. 1 may process read requests and write requests and provide read and write responses. Generally, a write request includes a data unit to be written to the memory sub-system 100 and a logical address referring to that data unit. The memory sub-system 100 executes a write operation to write the data unit to one or more physical addresses of the memory components. For example, the write operation may be executed by the memory system controller. The write operation includes generating a logical-to-physical (L2P) entry for the data unit. The L2P entry relates the logical address for the data unit provided with the write request to the physical address or addresses at the memory component to which the data unit is written.

Although the read operation and write operation are described herein as being executed by the memory sub-system 100 (e.g., the controller thereof), in some examples, read and write operations, as described herein, may be executed at the host system. Also, the write request and read request may originate at the host system or may be initiated at the memory sub-system 100.

When a temperature sensor reports that the temperature has reached or exceeded a predetermined threshold (e.g., 70 degrees Centigrade), the controller slows the rate at which memory operations are performed to reduce the generation of heat. Enclosing the PCB 110 between the top heatsink 120 and the bottom heat spreader 140 allows heat generated by the memory components and other components of the memory sub-system 100 to be absorbed by the enclosure. Heat transferred to the top heatsink 120 is more effectively transferred to the ambient environment by virtue of the large surface area of the heat fins of the top heatsink 120. Heat transferred to the bottom heat spreader 140 is transferred among the components of the PCB 110 and between the bottom heat spreader 140 and the top heatsink 120.

Thermal compound 180 may be added between the bottom heat spreader 140 and the PCB 110, between the top heatsink 120 and the PCB 110, or both. The thermal compound 180 may be selected to provide both heat properties and non-slip properties. The heat properties may include a high thermal breakdown temperature, a high thermal conductivity, or both. The non-slip properties may serve to maintain the position of the PCB 110 within the enclosure. For example, the bottom heat spreader 140 encloses the PCB 110 on three sides (to the bottom, left and right), and the top heatsink 120 encloses the PCB 110 from above, but neither the bottom heat spreader 140 nor the top heatsink 120 encloses the PCB from the front or the back. The non-slip properties of the thermal compound 180 may glue the PCB 110 in place so that the PCB 110 does not slide out of the enclosure.

The fasteners 130A, 130B, 130C, and 130D fasten the bottom heat spreader 140 to the top heatsink 120, placing the top heatsink 120 in direct contact with the bottom heat spreader 140 and facilitating heat transfer between the two components. The fasteners 130A-130D may also conduct heat between the top heatsink 120 and the bottom heat spreader 140. The fasteners 130A-130D may be screws, rivets, or other fasteners. The fasteners 130A-130D may be configured to conduct heat between the top heatsink 120 and the bottom heat spreader 140 once in place. For example, metal screws may conduct heat once tightened. Additionally, a feature 150 (e.g., a tab) of the bottom heat spreader 140 may be in contact with a feature 160 (e.g., a slot) of the top heatsink 120, further facilitating the transfer of heat between the two components.

By interconnecting the bottom heat spreader 140 and the top heatsink 120, the amount of heat that can be generated by the memory components before thermal throttling begins is increased. The feature 150 and the feature 160 may create an interference fit between the top heatsink 120 and the bottom heat spreader 140. An interference fit is a form of fastening between two tight fitting mating parts that produces a joint that is held together by friction after the parts are pushed together.

The bottom heat spreader 140 is formed of a substance with high thermal conductivity (i.e., a thermal conductivity greater than one W/mK, such as any metal (e.g., copper), graphite, or graphene). Application of the bottom heat spreader 140 to the PCB 110 increases the surface area that radiates heat, increasing the ability of the memory sub-system 100 to dissipate heat and increasing the amount of heat that can be generated by the memory components before thermal throttling begins. Additionally, application of the bottom heat spreader 140 to other components that generate less heat allows transference of heat to those other components, further increasing the amount of heat that can be generated by the memory components before thermal throttling begins.

Figure 2:
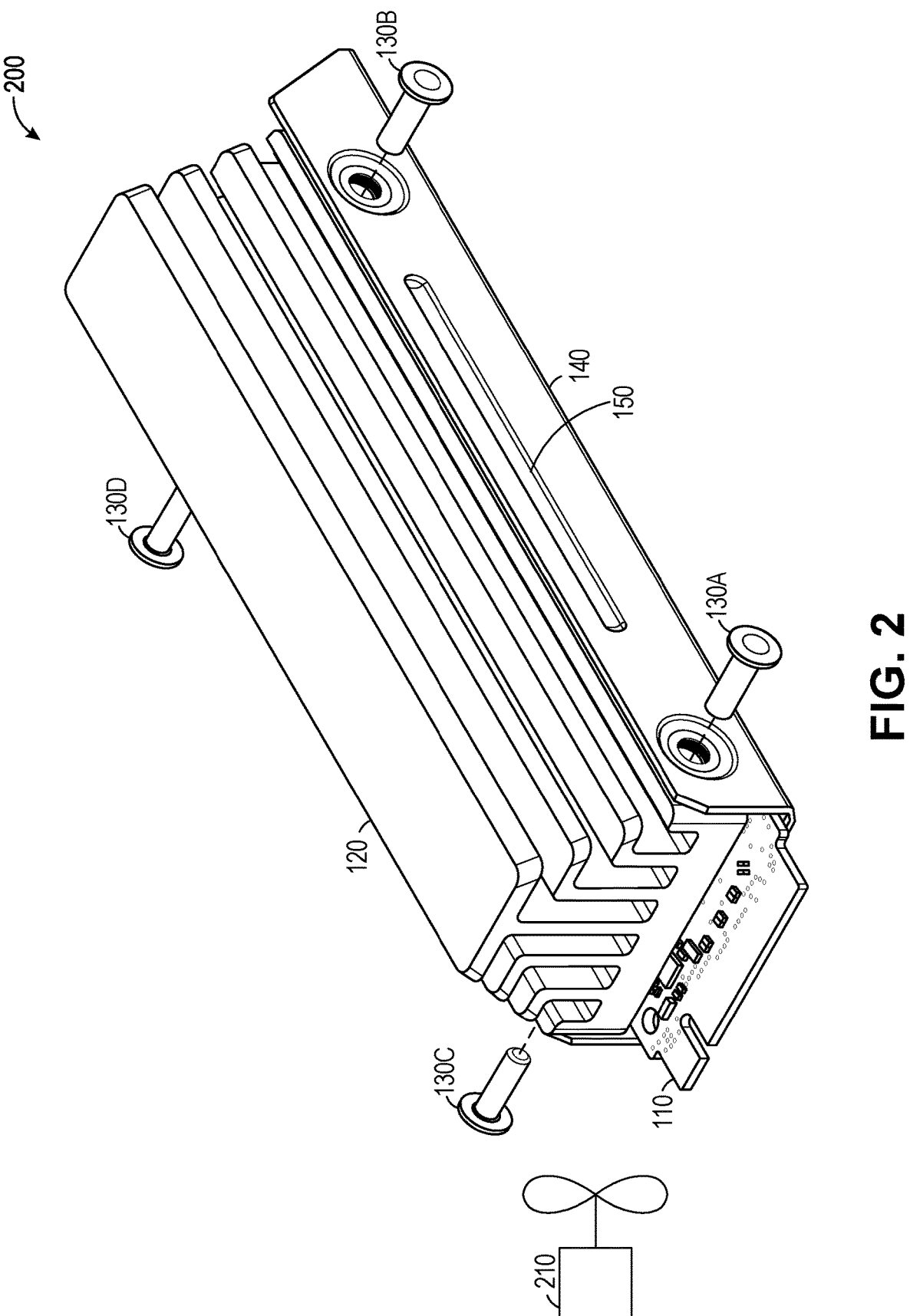
FIG. 2 illustrates the example memory sub-system, with a bottom heat spreader fastened to a top heatsink.

FIG. 2 illustrates the example memory sub-system 100 in a closed view 200, with the bottom heat spreader 140 fastened to the top heatsink 120. The feature 150 is coupled to the feature 160, hiding the feature 160 from view. A fan 210 is also shown. The fan 210 is configured to blow air through the length of the fins of the top heatsink 120.

The top heatsink 120, the bottom heat spreader 140, and the fasteners 130A-130D together comprise an enclosure for the memory sub-system 100. As can be seen in FIG. 2, the top heatsink 120 comprises a plurality of fins in three different shapes. The center fin has a "T" shape. The two edge fins are vertical. The four intermediate fins between the center fin and the edge fins have an inverted "L" shape. The horizontal portions of the center and intermediate fins extend over the gap between the vertical portion of the fin and the adjacent fin. In a traditional heatsink design, all fins are vertical.

When the fan 210 blows cool air into the space between fins in a traditional design, the air is quickly heated by the fins and begins to rise. As a result, the air flow created by the fan begins passing horizontally between the fins but rises before reaching the opposite end of the enclosure. For the portion of the enclosure farthest from the fan, the fan does not enhance the cooling provided by the traditional design.

The addition of the horizontal portions of the fins slows the rate at which air can leave the enclosure in the vertical direction. The horizontal portions of the fins serve to guide air through the entire length of the enclosure, enhancing the heat dissipation effects of the enclosure for portions of the memory sub-system 100 that are farther from the fan 210.

Figure 3:
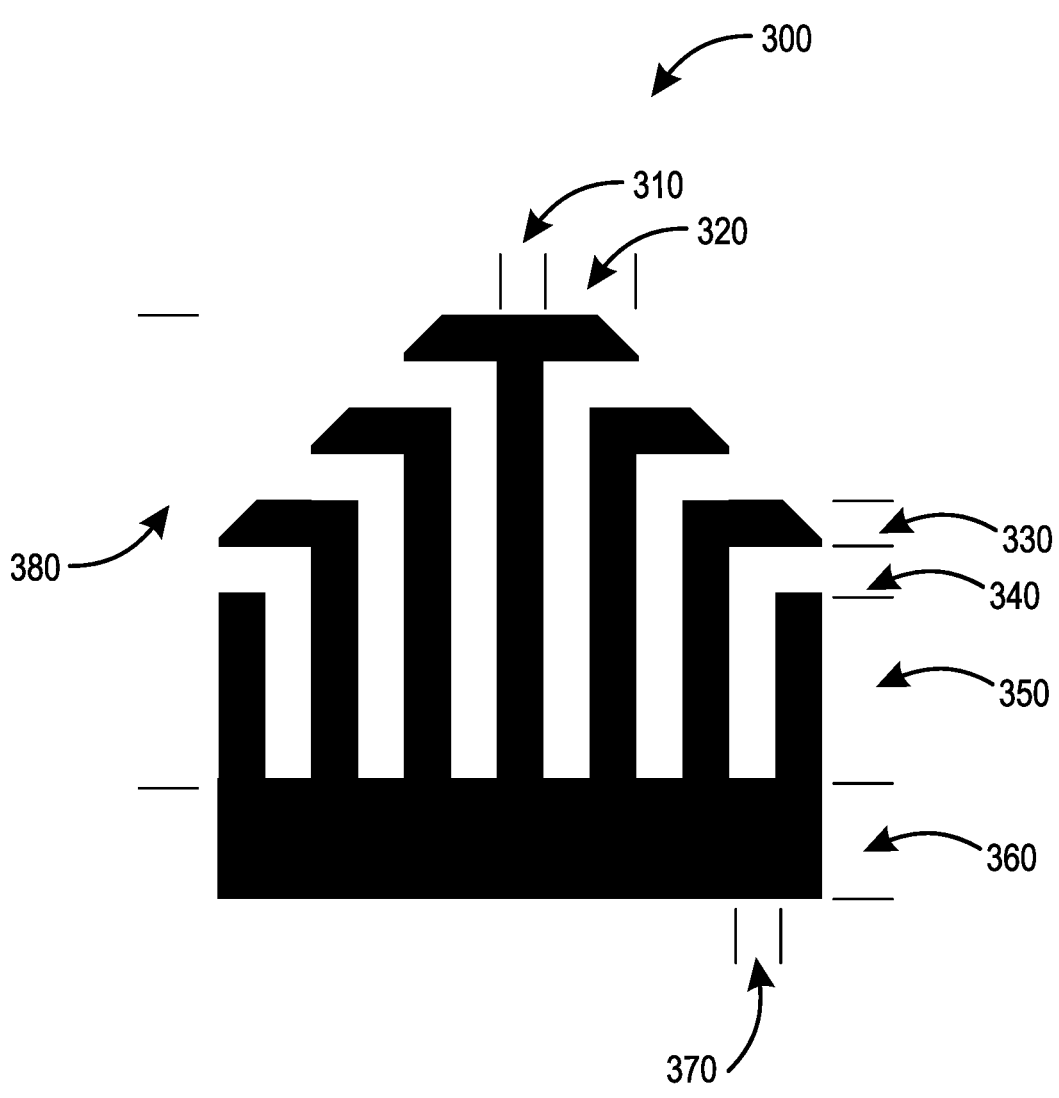
FIG. 3 illustrates another view of the top heatsink of FIG. 2.

FIG. 3 illustrates another view 300 of the top heatsink of FIG. 2. In the example of FIG. 3, each of the seven vertical fins has equal thickness for the fin width 310. In some example embodiments, the fin width 310 is 0.25 mm, 0.3 mm, 0.5 mm, 1.0 mm, or less than 1.0 mm. The thicknesses of the vertical fins may not all be equal. In some example embodiments, the central, "T"-shaped fin, has greater thickness than the other fins to better support the greater weight of the larger horizontal portion.

In the example of FIG. 3, the horizontal spacing 370 between each pair of adjacent vertical fins has an equal width. In various example embodiments, the horizontal spacing 370 is equal to, less than, or greater than the equal fin width 310. The widths of the horizontal spaces may not all be equal.

The thickness 330 of the horizontal fin portions may be equal to the thickness 310 of the vertical fin portions. In various example embodiments, the thickness 330 is greater than or less than the thickness 310. In the example of FIG. 3, the thickness 330 is the same for all horizontal portions, but in various example embodiments, the thickness 330 may vary. The vertical spacing 340 between horizontal fin portions is equal in the example of FIG. 3. In various example embodiments, the vertical spacing 340 is equal to, less than, or greater than the horizontal spacing 370. The heights of the vertical spaces may not all be equal.

The horizontal overhang 320 for the "T" and inverted-"L" portions is equal for all fins in the example of FIG. 3. The size of the horizontal overhang is, in various example embodiments, equal to the sum of the horizontal spacing 370 and the fin width 310, greater than the sum of the horizontal spacing 370 and the fin width 310, equal to the horizontal spacing 370, greater than the horizontal spacing 370, or any suitable combination thereof. The width of the horizontal portion of the "T"-shaped center fin is equal to twice the horizontal overhang 320 plus the fin width 310. The width of the horizontal portions of the inverted-"L" fins is equal to the horizontal overhang 320 plus the fin width 310.

The outer fin height 350 may be 1 mm, 5 mm, 10 mm, less than 10 mm, a multiple of the horizontal spacing 370, a multiple of the vertical spacing 340, or any suitable combination thereof. The center fin height 380 may be 10 mm, 20 mm, 25 mm, 30 mm, less than 30 mm, a multiple of the outer fin height 350, a multiple of the horizontal spacing 370, a multiple of the vertical spacing 340, or any suitable combination thereof.

As shown in FIG. 3, the horizontal fin portions do not end in right angles. The ends of the horizontal fin portions may be formed so that a straight line connects the top corner of each side of the "T" of the center fin with the bottom corner of the edge-most fin with a horizontal portion, running along the edge of each horizontal fin portion in between. In other example embodiments, the horizontal fin portions end in right angles.

The base of the top heatsink has a thickness 360. The thickness 360 may be greater than the fin width 310, greater than the horizontal spacing 370, a multiple of the fin width 310, 1.0 mm, 2.0 mm, 2.5 mm, less than 10 mm, in the range 5 mm-10 mm, or any suitable combination thereof.

Figure 4:
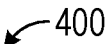
FIG. 4 illustrates another example memory sub-system in accordance with some embodiments of the present disclosure, in an exploded view.

FIG. 4 illustrates example memory sub-system 400 in accordance with some embodiments of the present disclosure, in an exploded view. The memory sub-system 400 includes a PCB 410, a top enclosure 420, heatsinks 430A and 430B, thermal gap pads 440A, 440B, 440C, 440D, 440E, 440F, and 440G, and a bottom enclosure 450. As discussed with respect to the PCB 110 of FIG. 1, the PCB 410 may include memory components and a controller and be configured to perform memory operations for a host. The top enclosure 420 and the bottom enclosure 450 may be composed of a material with high thermal conductivity.

The top enclosure 420 may transfer heat from the top side of the PCB 410 to the environment. The bottom enclosure 450 may transfer heat from the bottom side of the PCB 410 to the environment. If one side of the PCB 410 generates more heat than the other, or if, due to environmental considerations (e.g., the memory sub-system 400 being placed on a wooden desk) the heat transfer rate from one of the enclosures 420, 450 is faster than the heat transfer rate from the other, a temperature imbalance between the two sides of the PCB 410 may result. Once any component on the PCB 410 exceeds its operating temperature range, the results of operations performed by the PCB 410 will cease to be reliable. Accordingly, balancing the temperature of the top and bottom of the PCB 410 will help ensure reliable operation of the memory sub-system 400.

The heatsinks 430A and 430B may be U-shaped vapor chamber heatsinks (e.g., titanium-based vapor chambers or copper-based vapor chambers) that effectively transfer heat between the top enclosure 420 and the bottom enclosure 450. The heatsinks 430A-430B may be 0.3 mm thick. One side of each heatsink 430A, 430B may be in contact with one side of the PCB 410 and the other side of each heatsink 430A, 430B may be in contact with the other side of the PCB 410. Thus, the heatsinks 430A-430B may be configured to transfer heat between the two sides of the PCB 410. The heatsinks 430A-430B may have thermal conductivities greater than 1000 W/mK.

The thermal gap pads 440A-440G are made of a thermally conductive material and thermally couple the heatsinks 430A-430B to the top enclosure 420 and the bottom enclosure 450. For example, the size of the enclosure may be larger than the size of the PCB 410 in combination with the heatsinks 430A-430B. Using a thermally conductive material to couple the heatsinks 430A-430B to top enclosure 420 and the bottom enclosure 450 allows for the efficient transfer of heat from the heatsinks 430A-430B to the enclosure. The thermal coupling of the heatsinks 430A-430B to the top enclosure 420 or the bottom enclosure 450 may be accomplished by placing a thermal gap pad in contact with a heatsink and the top or bottom enclosure.

Figure 5:
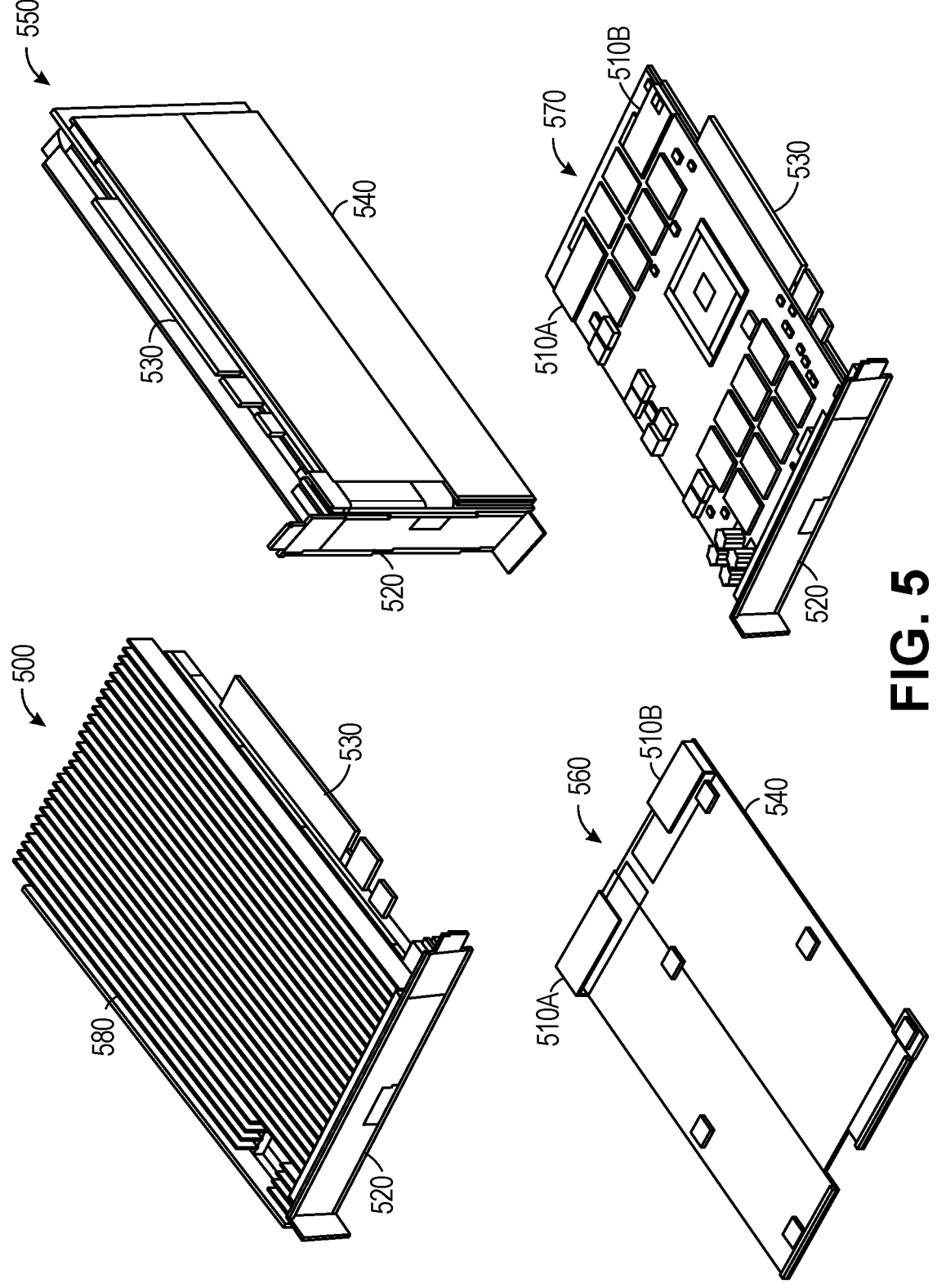
FIG. 5 illustrates views of an example memory sub-system in accordance with some embodiments of the present disclosure.

FIG. 5 illustrates views 500, 550, 560, and 570 of an example memory sub-system in accordance with some embodiments of the present disclosure. The view 560 shows a bottom cover 540 to which U-shaped vapor chambers 510A and 510B are affixed. The view 570 shows the PCB 530 added to the bottom cover 540 and between the arms of the U's of the U-shaped vapor chambers 510A and 510B. Thus, the U-shaped vapor chambers 510A and 510B convey heat from the warmer side of the PCB 530 to the cooler side of the PCB 530, helping reduce the maximum temperature within the memory sub-system. The view 570 also shows the I/O bracket 520 (e.g., a PCI I/O bracket). The I/O bracket 520 may be used to mount the memory sub-system to a chassis for coupling with a host device.

The view 500 shows top heatsink 580 covering the PCB 530 and connected to the I/O bracket 520 and the bottom cover 540. The top heatsink 580 comprises a plurality of fins, increasing the surface area of the top heatsink 580 and allowing for more rapid dissipation of heat into the environment. The top heatsink 580 and the bottom cover 540 are in contact with the U-shaped vapor chambers 510A and 510B, allowing heat to be radiated out of the memory sub-system. The enclosure is configured to transfer heat from the bottom cover 540 to the top heatsink 580. The view 550 shows the same elements as the view 500, from a different angle. By comparison with memory sub-systems lacking the U-shaped vapor chambers 510A and 510B, heat is radiated from the memory sub-system of FIG. 5 more effectively. For example, the bottom cover 540 may be in contact with an insulator or still air while the top heatsink 580 is placed in a path of moving air. Without the U-shaped vapor chambers 510A and 510B, the heat from the bottom of the PCB 530 and the bottom cover 540 will not be discharged through the top heatsink 580, possibly causing thermal failure of components of the PCB 530. With the U-shaped vapor chambers 510A and 510B, the heat from the bottom of the PCB 530 and the bottom cover 540 is transferred to the top heatsink 580, allowing the moving air to pass over the fins of the top heatsink 580 and transfer heat out of the memory sub-system. The U-shaped vapor chambers 510A-510B may be embedded in the bottom cover 540.

Figure 6:
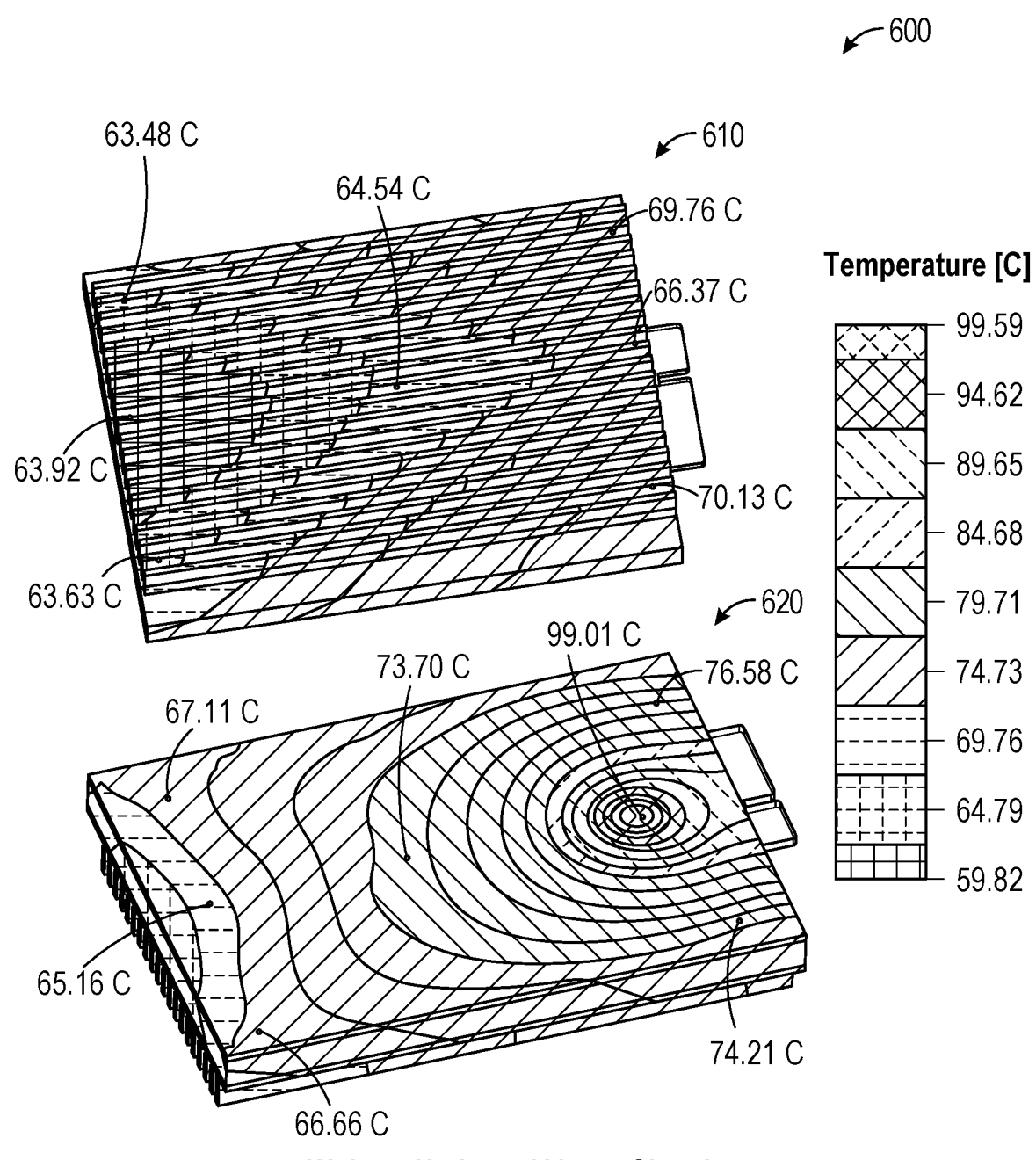
FIG. 6 illustrates heat distribution on a memory sub-system that does not use heat mitigation technologies discussed herein.

FIG. 6 illustrates heat distribution on a memory sub-system 600 that does not use heat mitigation technologies discussed herein. Heat distribution 610 is a top view and heat distribution 620 is a bottom view. The peak temperature in the heat distribution 610 is about 70° C. while the peak temperature in the heat distribution 620 is about 99° C. Without a mechanism for transferring heat from one side of the memory sub-system 600 to the other, the temperature difference between the two sides is nearly 30° C.

Figure 7:
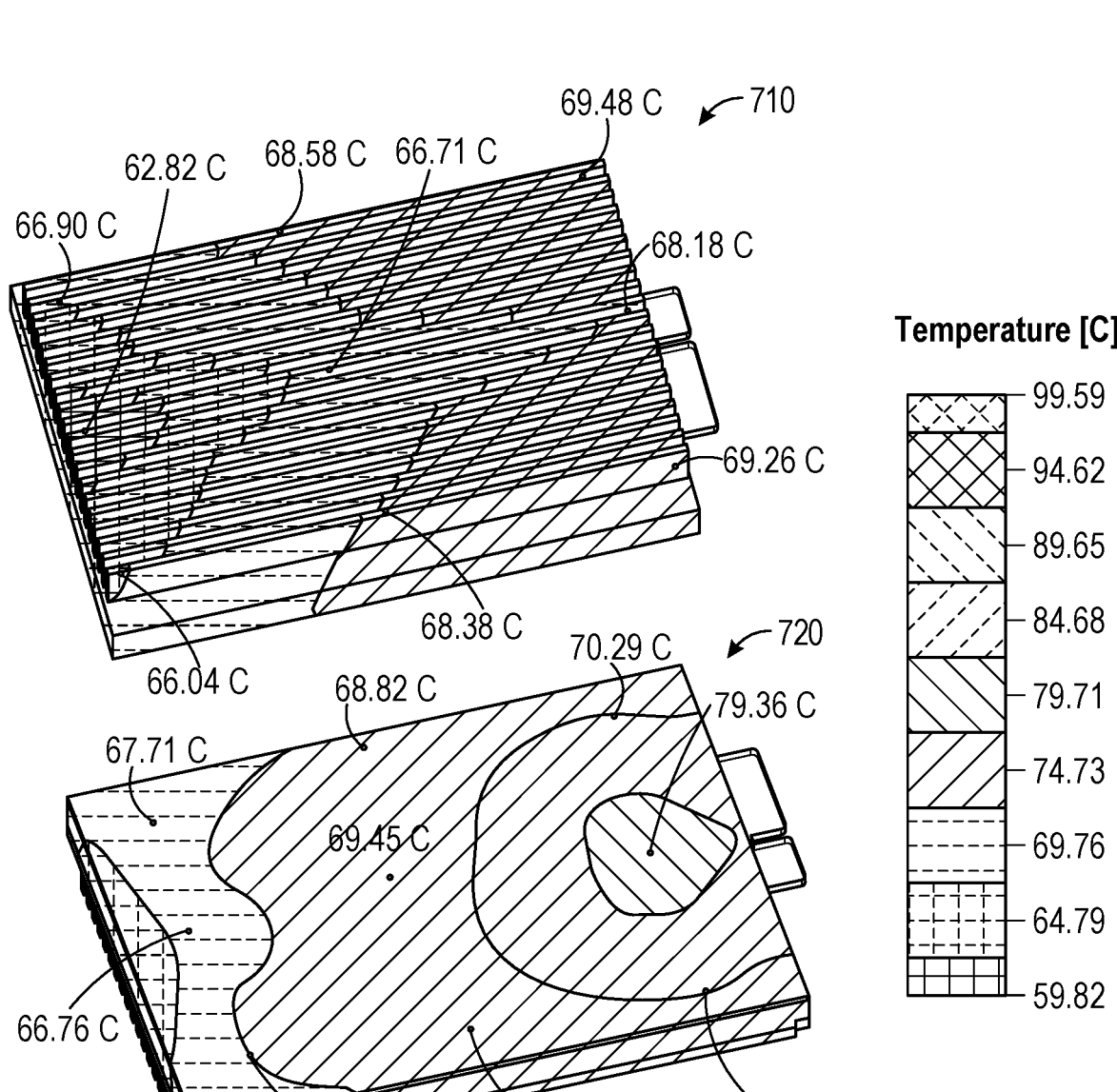
FIG. 7 illustrates heat distribution on a memory sub-system that uses heat mitigation technologies discussed herein.

FIG. 7 illustrates heat distribution on a memory sub-system 700 that uses heat mitigation technologies discussed herein. Heat distribution 710 is a top view and heat distribution 720 is a bottom view. The peak temperature in the heat distribution 710 is about 69° C. while the peak temperature in the heat distribution 720 is about 79° C. Because heat is transferred between the two sides of the memory sub-system 700, the temperature difference between the two sides is only about 10° C.

Figure 8:
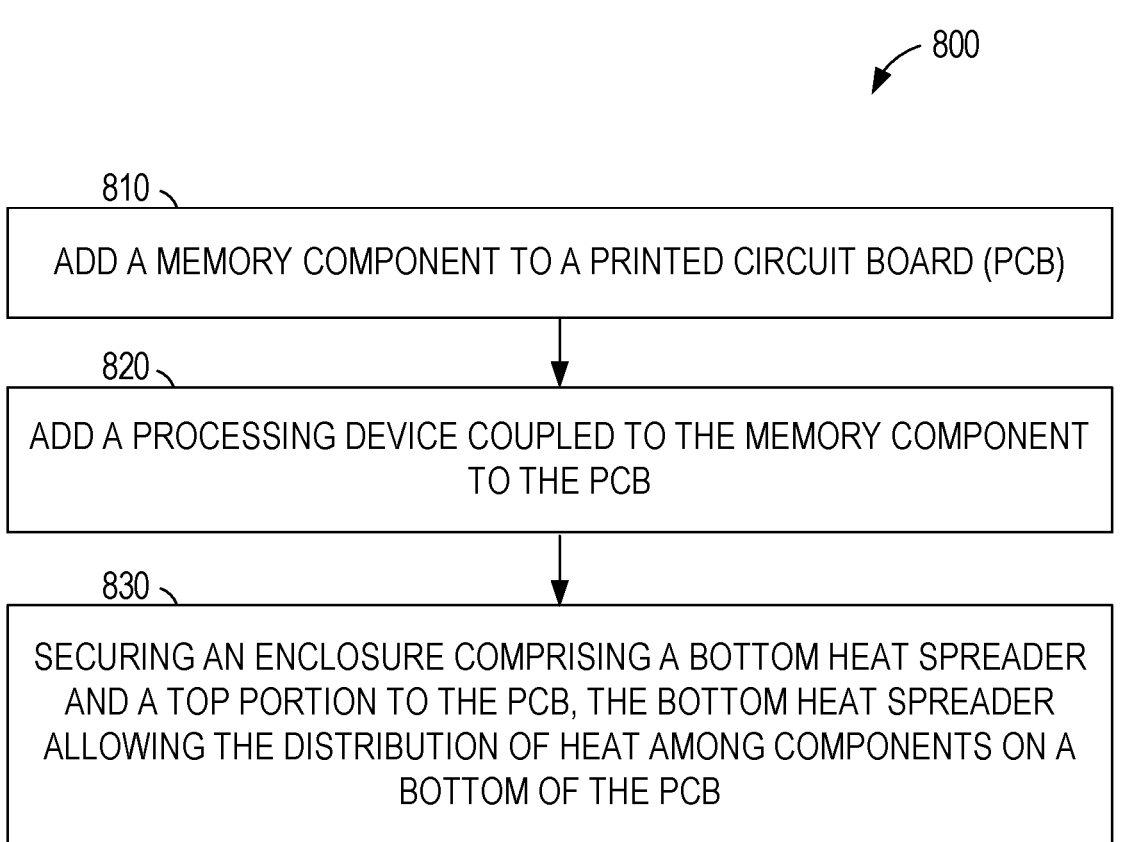
FIG. 8 is a flow diagram of an example method to assemble a memory sub-component that uses heat mitigation technologies, in accordance with some embodiments of the present disclosure.

FIG. 8 is a flow diagram of an example method 800 to assemble a memory sub-system that uses heat mitigation technologies, in accordance with some embodiments of the present disclosure. The method 800 includes steps 810, 820, and 830.

In step 810, a memory component is added to a PCB. For example, the memory component 170 may be soldered to the PCB 110, both of FIG. 1. A processing device coupled to the memory component is added to the PCB in step 820. For example, an external memory controller may be added to the PCB 110 and coupled to the memory component 170 to control memory access operations.

An enclosure comprising a bottom heat spreader and a top portion is secured to the PCB in step 830. The bottom heat spreader allows the distribution of heat among components on a bottom of the PCB. For example, the enclosure of FIG. 1, comprising the bottom heat spreader 140 and the top heatsink 120, may be secured to the PCB 110. As another example, the enclosure of FIG. 4, comprising the bottom enclosure 450 and the top enclosure 420, may be secured to the PCB 410.

To better illustrate the methods and apparatuses described herein, a non-limiting set of Example embodiments are set forth below as numerically identified Examples.

Example 1 is a memory sub-system enclosure, comprising: a bottom heat spreader that allows distribution of heat among components on a bottom of a PCB enclosed in the memory sub-system enclosure; and a top portion that comprises a plurality of fins configured to radiate heat into an environment of the memory sub-system enclosure, the plurality of fins comprising a first fin with a first horizontal portion and a second fin without a horizontal portion.

In Example 2, the subject matter of Example 1, wherein the enclosure further comprises: a plurality of fasteners connecting the bottom heat spreader and the top portion, the fasteners configured to conduct heat between the bottom heat spreader and the top portion.

In Example 3, the subject matter of Example 2, wherein the bottom heat spreader comprises a feature that creates an interference fit with the top portion once the plurality of fasteners are tightened, the interference fit configured to conduct heat between the bottom heat spreader and the top portion.

In Example 4, the subject matter of Examples 1-3 includes a titanium-based vapor chamber configured to transfer heat between the bottom heat spreader and the top portion of the memory sub-system enclosure.

In Example 5, the subject matter of Example 4 includes a thermal gap pad in contact with the titanium-based vapor chamber and the top portion.

In Example 6, the subject matter of Examples 4-5, wherein the titanium-based vapor chamber is a U-shaped 0.3 mm thick titanium-based vapor chamber.

In Example 7, the subject matter of Examples 1-6, wherein the first fin and the second fin both have vertical portions.

In Example 8, the subject matter of Examples 1-7, wherein the horizontal portion of the second fin extends over a horizontal space between the second fin and the first fin.

In Example 9, the subject matter of Examples 1-8, wherein the plurality of fins comprises a third fin with a second horizontal portion, and a fourth fin with a third horizontal portion.

In Example 10, the subject matter of Example 9, wherein a first width of the first horizontal portion is greater than a second width of the second horizontal portion and the second width is equal to a third width of the third horizontal portion.

In Example 11, the subject matter of Examples 1-10, wherein a horizontal spacing between adjacent pairs of the plurality of fins is equal for each adjacent pair.

In Example 12, the subject matter of Examples 1-11, wherein one fin of the plurality of fins has a greater thickness than the other fins of the plurality of fins.

In Example 13, the subject matter of Examples 1-12, wherein a third fin of the plurality of fins does not have a horizontal portion, the first horizontal portion overhangs space between the first fin and two adjacent fins, and the fins of the plurality of fins other than the first fin, the second fin, and the third fin, have a horizontal portion that overhangs space between said fin and one adjacent fin.

In Example 14, the subject matter of Examples 1-13, wherein a base of the top portion is thicker than each fin of the plurality of fins.

Example 15 is a method of manufacturing a memory sub-system comprising: securing, to a printed circuit board (PCB), an enclosure comprising: a bottom heat spreader that allows distribution of heat among components on a bottom of the PCB; and a top portion that comprises a plurality of fins configured to radiate heat into an environment of the memory sub-system, the plurality of fins comprising a first fin with a first horizontal portion and a second fin with a horizontal portion.

In Example 16, the subject matter of Example 15, wherein the enclosure further comprises: a plurality of fasteners connecting the bottom heat spreader and the top portion, the fasteners configured to conduct heat between the bottom heat spreader and the top portion.

In Example 17, the subject matter of Examples 15-16, wherein the first fin and the second fin both have vertical portions.

In Example 18, the subject matter of Examples 15-17, wherein one fin of the plurality of fins has a greater thickness than the other fins of the plurality of fins.

In Example 19, the subject matter of Examples 15-18, wherein a third fin of the plurality of fins does not have a horizontal portion, the first horizontal portion overhangs space between the first fin and two adjacent fins, and the fins of the plurality of fins other than the first fin, the second fin, and the third fin, have a horizontal portion that overhangs space between said fin and one adjacent fin.

In Example 20, the subject matter of Examples 15-19, wherein a base of the top portion is thicker than each fin of the plurality of fins.

Example 21 is at least one machine-readable medium including instructions that, when executed by processing circuitry, cause the processing circuitry to perform operations to implement any of Examples 1-20.

Example 22 is an apparatus comprising means to implement any of Examples 1-20.

FIG. 9 illustrates a block diagram of an example machine 900 with which, in which, or by which any one or more of the techniques (e.g., methodologies) discussed herein can be implemented. Examples, as described herein, can include, or can operate by, logic or a number of components, or mechanisms in the machine 900. Circuitry (e.g., processing circuitry) is a collection of circuits implemented in tangible entities of the machine 900 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 900.

In alternative embodiments, the machine 900 can operate as a standalone device or can be connected (e.g., networked) to other machines. In a networked deployment, the machine 900 can operate in the capacity of a server machine, a client machine, or both in server-client network environments. In an example, the machine 900 can act as a peer machine in peer-to-peer (P2P) (or other distributed) network environment. The machine 900 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 900 (e.g., computer system) can include a hardware processor 902 (e.g., a central processing unit (CPU), a graphics processing unit (GPU), a hardware processor core, or any combination thereof), a main memory 904, a static memory 906 (e.g., memory or storage for firmware, microcode, a basic-input-output (BIOS), unified extensible firmware interface (UEFI), etc.), and mass storage device 908 (e.g., hard drives, tape drives, flash storage, or other block devices) some or all of which can communicate with each other via an interlink 930 (e.g., bus). The machine 900 can further include a display device 910, an alphanumeric input device 912 (e.g., a keyboard), and a user interface (UI) navigation device 914 (e.g., a mouse). In an example, the display device 910, the input device 912, and the UI navigation device 914 can be a touch screen display. The machine 900 can additionally include a signal generation device 918 (e.g., a speaker), a network interface device 920, and one or more sensor(s) 916, such as a global positioning system (GPS) sensor, compass, accelerometer, or other sensor. The machine 900 can include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 902, the main memory 904, the static memory 906, or the mass storage device 908 can be, or include, a machine-readable media 922 on which is stored one or more sets of data structures or instructions 924 (e.g., software) embodying or used by any one or more of the techniques or functions described herein. The instructions 924 can also reside, completely or at least partially, within any of registers of the hardware processor 902, the main memory 904, the static memory 906, or the mass storage device 908 during execution thereof by the machine 900. In an example, one or any combination of the hardware processor 902, the main memory 904, the static memory 906, or the mass storage device 908 can constitute the machine-readable media 922. While the machine-readable media 922 is illustrated as a single medium, the term "machine-readable medium" can include a single medium or multiple media (e.g., a centralized or distributed database, or associated caches and servers) configured to store the one or more instructions 924.

The term "machine readable medium" can include any medium that is capable of storing, encoding, or carrying instructions for execution by the machine 900 and that cause the machine 900 to perform any one or more of the techniques of the present disclosure, or that is capable of storing, encoding, or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine-readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks.

In an example, information stored or otherwise provided on the machine-readable media 922 can be representative of the instructions 924, such as instructions 924 themselves or a format from which the instructions 924 can be derived. This format from which the instructions 924 can be derived can include source code, encoded instructions (e.g., in compressed or encrypted form), packaged instructions (e.g., split into multiple packages), or the like. The information representative of the instructions 924 in the machine-readable media 922 can be processed by processing circuitry into the instructions to implement any of the operations discussed herein. For example, deriving the instructions 924 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 924.

In an example, the derivation of the instructions 924 can include assembly, compilation, or interpretation of the information (e.g., by the processing circuitry) to create the instructions 924 from some intermediate or preprocessed format provided by the machine-readable media 922. The information, when provided in multiple parts, can be combined, unpacked, and modified to create the instructions 924. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, compiled or interpreted (e.g., into a library, stand-alone executable etc.) at a local machine, and executed by the local machine.

The instructions 924 can be further transmitted or received over a communications network 926 using a transmission medium via the network interface device 920 utilizing any one of a number of transfer protocols (e.g., frame relay, internet protocol, transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 920 can include one or more physical jacks (e.g., Ethernet, coaxial, or phone jacks) or one or more antennas to connect to the network 926. In an example, the network interface device 920 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 900, and includes digital or analog communications signals or other intangible medium to facilitate communication of such software. A transmission medium is a machine readable medium.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system enclosure, comprising:

a bottom heat spreader that allows distribution of heat among components on a bottom of a PCB enclosed in the memory sub-system enclosure; and and a top portion that comprises a plurality of fins configured to radiate heat into an environment of the memory sub-system enclosure, the plurality of fins comprising a first fin with a first horizontal portion, a second fin without a horizontal portion, and a third fin without a horizonal portion;

wherein the first horizontal portion overhangs a space between the first fin and two fins adjacent and on opposite sides of the first fin; and the fins of the plurality of fins other than the first fin, the second fin, and the third fin, have a horizontal portion that overhangs space between said fin and one adjacent fin.

2. The memory sub-system enclosure of claim 1, further comprising:

a plurality of fasteners connecting the bottom heat spreader and the top portion, the fasteners configured to conduct heat between the bottom heat spreader and the top portion.

3. The memory sub-system enclosure of claim 2, wherein the bottom heat spreader comprises a feature that creates an interference fit with the top portion once the plurality of fasteners are tightened, the interference fit configured to conduct heat between the bottom heat spreader and the top portion.

4. The memory sub-system enclosure of claim 1, further comprising:

a titanium-based vapor chamber configured to transfer heat between the bottom heat spreader and the top portion of the memory sub-system enclosure.

5. The memory sub-system enclosure of claim 4, further comprising:

a thermal gap pad in contact with the titanium-based vapor chamber and the top portion.

6. The memory sub-system enclosure of claim 4, wherein the titanium-based vapor chamber is a U-shaped 0.3 mm thick titanium-based vapor chamber.

7. The memory sub-system enclosure of claim 1, wherein the first fin and the second fin both have vertical portions.

8. The memory sub-system enclosure of claim 1, wherein the horizontal portion of the first fin extends over a space between the second fin and the first fin.

9. The memory sub-system enclosure of claim 1, wherein the plurality of fins comprises a third fin with a second horizontal portion, and a fourth fin with a third horizontal portion.

10. The memory sub-system enclosure of claim 9, wherein a first width of the first horizontal portion is greater than a second width of the second horizontal portion and the second width is equal to a third width of the third horizontal portion.

11. The memory sub-system enclosure of claim 1, wherein a horizontal spacing between adjacent pairs of the plurality of fins is equal for each adjacent pair.

12. The memory sub-system enclosure of claim 1, wherein one fin of the plurality of fins has a greater thickness than other fins of the plurality of fins.

13. The memory sub-system enclosure of claim 1, wherein a base of the top portion is thicker than each fin of the plurality of fins.

14. A method of manufacturing a memory sub-system comprising:

securing, to a printed circuit board (PCB), an enclosure comprising:

a bottom heat spreader that allows distribution of heat among components on a bottom of the PCB; and and a top portion that comprises a plurality of fins configured to radiate heat into an environment of the memory sub-system, the plurality of fins comprising a first fin with a first horizontal portion, a second fin without a horizontal portion, and a third fin without a horizontal portion;

wherein the first horizontal portion overhangs a space between the first fin and two fins adjacent and on opposite sides of the first fin; and the fins of the plurality of fins other than the first fin, the second fin, and the third fin, have a horizontal portion that overhangs space between said fin and one adjacent fin.

15. The method of claim 14, wherein the enclosure further comprises:

a plurality of fasteners connecting the bottom heat spreader and the top portion, the fasteners configured to conduct heat between the bottom heat spreader and the top portion.

16. The method of claim 14, wherein the first fin and the second fin both have vertical portions.

17. The method of claim 14, wherein one fin of the plurality of fins has a greater thickness than other fins of the plurality of fins.

18. The method of claim 14, wherein a base of the top portion is thicker than each fin of the plurality of fins.

* * * * *